United States Patent
Yonemaru

(10) Patent No.: US 9,952,637 B2
(45) Date of Patent: Apr. 24, 2018

(54) HEAT DISSIPATION STRUCTURE FOR EXTERNAL APPARATUS, ELECTRONIC APPARATUS, AND EXTERNAL APPARATUS

(71) Applicant: NEC Platforms, Ltd., Kawasaki-shi, Kanagawa (JP)

(72) Inventor: Shinichirou Yonemaru, Kawasaki (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/306,135

(22) PCT Filed: Jul. 21, 2015

(86) PCT No.: PCT/JP2015/003642
§ 371 (c)(1),
(2) Date: Oct. 24, 2016

(87) PCT Pub. No.: WO2016/067492
PCT Pub. Date: May 6, 2016

(65) Prior Publication Data
US 2017/0052574 A1    Feb. 23, 2017

(30) Foreign Application Priority Data
Oct. 28, 2014    (JP) ................................ 2014-219466

(51) Int. Cl.
*H05K 7/20*    (2006.01)
*G06F 1/20*    (2006.01)

(52) U.S. Cl.
CPC ................ *G06F 1/20* (2013.01); *H05K 7/20* (2013.01); *H05K 7/20418* (2013.01)

(58) Field of Classification Search
None
See application file for complete search history.

(56) References Cited

U.S. PATENT DOCUMENTS 6,278,609 B1    8/2001 Suzuki et al.
6,762,932 B2 *  7/2004 Regimbal ............... G06F 1/184
                                        361/679.33
(Continued)

FOREIGN PATENT DOCUMENTS

CN    1988785 A    6/2007
CN    101807095 A    8/2010
(Continued)

OTHER PUBLICATIONS

International Search Report for PCT/JP2015/003642 dated Sep. 1, 2015.
(Continued)

*Primary Examiner* — Courtney Smith
(74) *Attorney, Agent, or Firm* — Sughrue Mion, PLLC

(57) ABSTRACT

A heat dissipation structure for an external apparatus is a heat dissipation structure for an external apparatus in an electronic apparatus including a housing section configured to removably house an external apparatus. The heat dissipation structure for an external apparatus includes a heat dissipation portion, which is removably attached to the external apparatus and which has thermal conductivity for transferring heat generated by the external apparatus to the housing section.

9 Claims, 10 Drawing Sheets

(56) References Cited

U.S. PATENT DOCUMENTS

| | | | | |
|---|---|---|---|---|
| 7,345,237 B2* | 3/2008 | Chen | ................ | G06F 1/187 174/50 |
| 7,518,877 B2* | 4/2009 | Peng | ................ | G11B 33/12 361/610 |
| 8,885,342 B2* | 11/2014 | Skepnek | ................ | H01L 23/367 174/548 |
| 8,913,377 B2* | 12/2014 | Furuta | ................ | H05K 7/1489 361/679.33 |
| 2004/0105229 A1* | 6/2004 | Wang | ................ | G06F 1/187 361/679.33 |
| 2005/0088815 A1* | 4/2005 | Chen | ................ | G11B 33/124 361/679.36 |
| 2007/0006996 A1* | 1/2007 | Mikubo | ................ | G06F 1/203 165/104.33 |
| 2007/0146990 A1 | 6/2007 | Hsieh | | |
| 2009/0279242 A1* | 11/2009 | Yang | ................ | G06F 1/187 361/679.31 |
| 2010/0027220 A1* | 2/2010 | Hughes | ................ | H05K 7/20445 361/702 |
| 2010/0202274 A1 | 8/2010 | Kaneko et al. | | |
| 2010/0246136 A1 | 9/2010 | Yu et al. | | |
| 2012/0236435 A1* | 9/2012 | Kaneko | ................ | G06F 1/187 360/97.19 |
| 2015/0262907 A1* | 9/2015 | Degner | ................ | H05K 1/181 361/679.47 |

FOREIGN PATENT DOCUMENTS

| | | |
|---|---|---|
| CN | 101848622 A | 9/2010 |
| JP | 10-98289 A | 4/1998 |
| JP | 2006-24948 A | 1/2006 |
| JP | 2008-282074 A | 11/2008 |
| JP | 2008-310855 A | 12/2008 |

OTHER PUBLICATIONS

Written Opinion for PCT/JP2015/003642 dated Sep. 1, 2015.
Communication dated May 10, 2017 issued by the State Intellectual Property Office of People's Republic of China in counterpart application No. 201580023547.6.

* cited by examiner

HEAT DISSIPATION STRUCTURE FOR EXTERNAL APPARATUS, ELECTRONIC APPARATUS, AND EXTERNAL APPARATUS

CROSS REFERENCE TO RELATED APPLICATIONS

This application is a National Stage of International Application No. PCT/JP2015/003642 filed Jul. 21, 2015, claiming priority based on Japanese Patent Application No. 2014-219466 filed Oct. 28, 2014, the contents of all of which are incorporated herein by reference in their entirety.

TECHNICAL FIELD

This invention relates to a heat dissipation structure for an external apparatus, to an electronic apparatus, and to an external apparatus.

BACKGROUND ART

Some external apparatus that are housed in electronic apparatus (for example, information processing apparatus) require a heat dissipation structure having a hard disk drive (HDD) mounted thereon.

In Patent Document 1, a heat dissipation mechanism for an external apparatus is disclosed. In the heat dissipation mechanism, a ring-shaped heat dissipation sheet is arranged on a holding portion configured to hold the external apparatus.

PRIOR ART DOCUMENT(S)

Patent Document(s)

Patent Document 1: JP-A-2008-282074

DISCLOSURE OF THE INVENTION

Problem to be Solved by the Invention

However, in Patent Document 1, the heat dissipation sheet, which is a component used for dissipating heat of the external apparatus, is arranged at an apparatus main-body side. Therefore, when maintenance (e.g., replacement) is conducted on the component used for dissipating heat of the external apparatus, there is a need to disassemble the apparatus main body, which leads to poor maintainability.

It is an object of this invention to provide a heat dissipation structure for an external apparatus on which maintenance may easily be conducted.

A heat dissipation structure for an external apparatus according to this invention is for use in an electronic apparatus comprising a housing section configured to removably house an external apparatus. The heat dissipation structure for an external apparatus comprises a heat dissipation portion, which is removably attached to the external apparatus and which has thermal conductivity for transferring heat generated by the external apparatus to the housing section.

An electronic apparatus according to this invention comprises a housing section configured to removably house the external apparatus. The external apparatus has removably attached thereto a heat dissipation portion having thermal conductivity for transferring heat generated by the external apparatus to the housing section.

An external apparatus according to this invention is removably housed in a housing section of an electronic apparatus. The external apparatus has removably attached thereto a heat dissipation portion having thermal conductivity for transferring heat generated by the external apparatus to the housing section.

Effect of the Invention

According to this invention, it is possible to obtain the heat dissipation structure for an external apparatus on which maintenance can easily be conducted.

MODE FOR EMBODYING THE INVENTION

Now, an embodiment of this invention is described in detail with reference to the drawings. Note that, similar descriptions are omitted in order to avoid complications due to repetition, and detailed descriptions of components that are not directly related to this invention are also omitted.

Embodiment

An embodiment according to this invention is described with reference to the drawings as appropriate.

Figure 1:
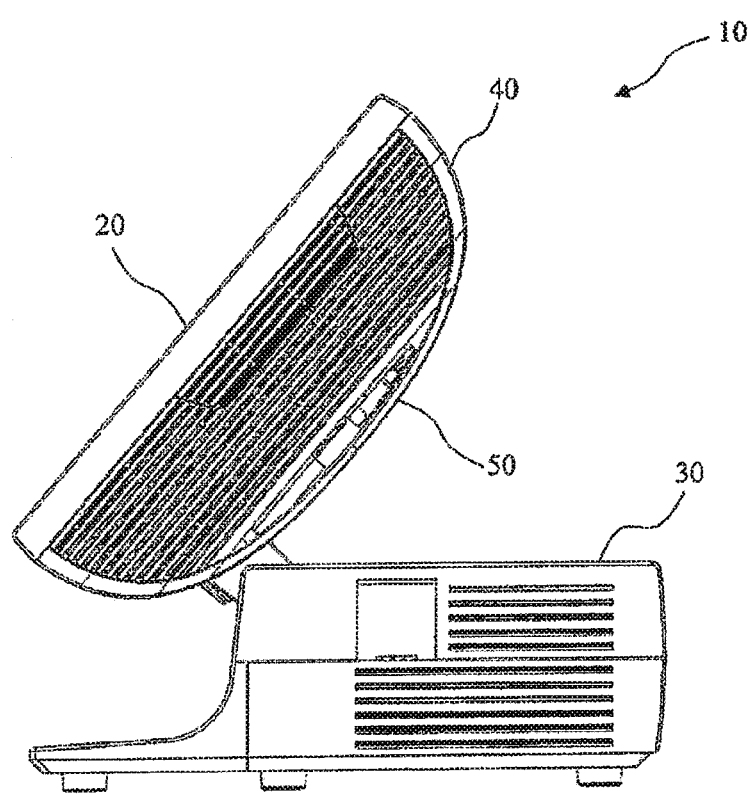
FIG. 1 is a side view of an electronic apparatus according to an embodiment of this invention.

First, with reference to FIG. 1, description is given of a configuration of an electronic apparatus having a heat dissipation structure according to this invention.

FIG. 1 is a side view of a point of sales (POS) terminal device 10 (electronic apparatus) having the heat dissipation structure for an external apparatus according to this invention. In the description below, the POS terminal device is described as an example of the electronic apparatus having the heat dissipation structure for an external apparatus, but the electronic apparatus according to this invention is not limited thereto.

The POS terminal device 10 includes a main body portion 20 and a power source unit 30.

The main body portion 20 includes a display with a touch panel, for example, and further includes a housing section configured to house (mount thereon) an external apparatus, e.g., an HDD, and a mother board. The main body portion 20 includes a top cover 40 and a rear cover 50. Through removal of the top cover 40 and the rear cover 50, the HDD can be mounted on or be removed from the housing section.

The power source unit 30 includes a DC power source configured to supply power to the main body portion 20.

Next, a configuration of the main body portion 20 is described with reference to FIG. 2.

Figure 2:
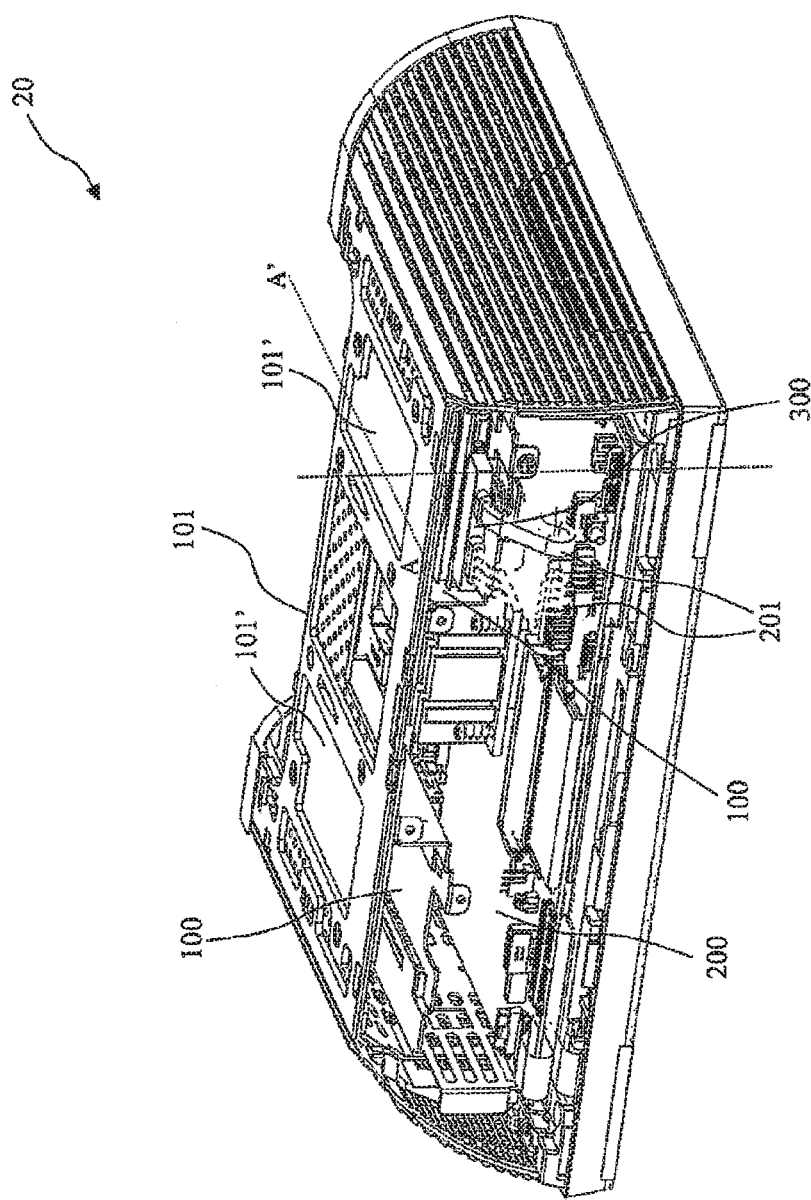
FIG. 2 is a perspective view of a main body portion of the electronic apparatus according to the embodiment.

FIG. 2 is a perspective view of the main body portion 20 from which the top cover 40 and the rear cover 50 are removed. The main body portion 20 includes two housing sections 100, a mother board 200, and the like.

The housing sections 100 may each house an external apparatus having an HDD or a solid state drive (SSD) mounted thereon, for example. The housing sections 100 are arranged inside a metal frame 101 of the main body portion 20 through use of metal. The housing sections 100 have structures in which housing-unit upper surfaces 101', which are part of the metal frame 101, are in contact with outside air. Therefore, the housing sections 100 can release heat generated therein to the outside air through the housing-unit upper surfaces 101'.

In FIG. 2, only one housing section 100 out of the two housing sections 100 houses an HDD unit 300, which is the external apparatus, but the other housing section 100 may also house the HDD unit 300. Further, the number of the housing sections 100 that the main body portion 20 includes is not limited, and the number of the housing sections 100 may be one or the main body portion 20 may include a greater number of the housing sections 100.

On the mother board 200, which serves as a control unit of the POS terminal device 10, electronic components, e.g., a central processing unit (CPU) (not shown) are mounted.

Figure 3:
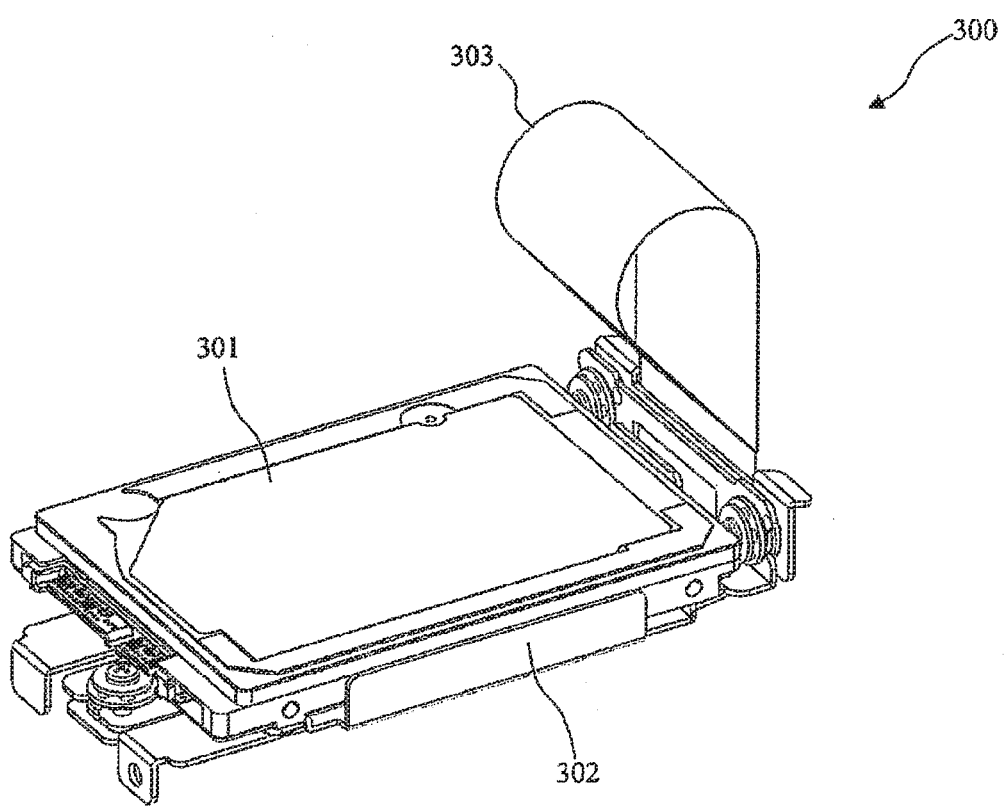
FIG. 3 is a perspective view of an HDD unit that is to be housed in the electronic apparatus according to the embodiment.

FIG. 3 is a perspective view of the HDD unit 300 according to this invention. The HDD unit 300 is housed in the housing section 100 and is electrically connected to the mother board 200 via cables 201.

Figure 4A:
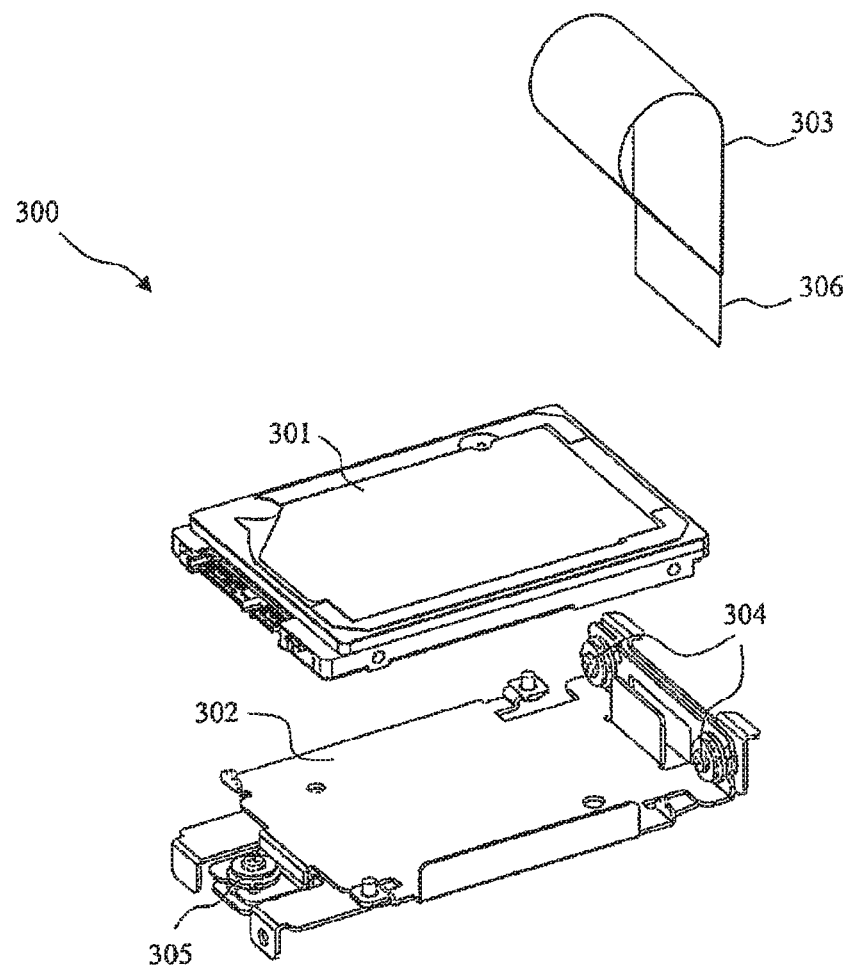
FIG. 4A is a view of components of the HDD unit that is to be housed in the electronic apparatus according to the embodiment.
Figure 4B:
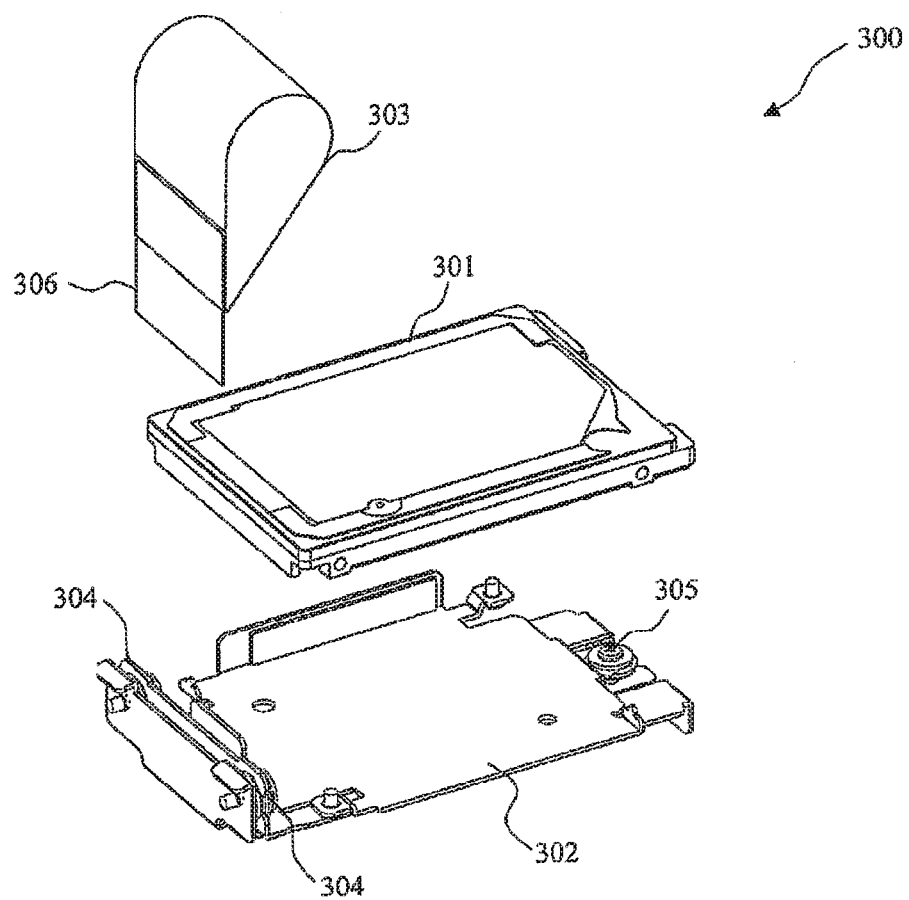
FIG. 4B is a view for illustrating the view of FIG. 4A from a different angle.

Next, a configuration of the HDD unit 300 is described with reference to FIG. 4A and FIG. 4B. FIG. 4A is a perspective view of the configuration of the HDD unit 300 that is to be housed in the housing section 100. FIG. 4B is a perspective view of the HDD unit 300 seen from an angle different from that of FIG. 4A.

The HDD unit 300 according to this invention includes an HDD main-body portion 301, an HDD holder 302, and a heat dissipation sheet 303 having a teardrop shape in side view (in cross section in a longitudinal direction).

The HDD main-body portion 301 has the HDD built therein.

The HDD holder 302 is configured to hold the HDD main-body portion 301. The HDD holder 302 includes two longitudinal-direction anti-vibration dampers 304 configured to reduce vibration of the HDD main-body portion 301 in a longitudinal direction, and one thickness-direction anti-vibration damper 305 configured to reduce vibration in a thickness direction. The longitudinal-direction anti-vibration dampers 304 and the thickness-direction anti-vibration damper 305 are configured to protect the HDD main-body portion 301 from impact or the like.

The heat dissipation sheet 303 is configured to transfer heat generated by the HDD main-body portion 301 to the housing section 100. The heat dissipation sheet 303 has thermal conductivity (thermal diffusivity) for at least transferring the heat generated by the HDD main-body portion 301 to the housing section 100, for example. Further, the heat dissipation sheet 303 has flexibility for at least preventing the heat dissipation sheet 303 from breaking when being bent to have a teardrop shape in side view, and for at least enabling the heat dissipation sheet 303 to maintain abutment to a ceiling of the housing section 100 and abutment to an upper surface of the HDD main-body portion 301 for a predetermined period of time (five years in this embodiment) when the HDD unit 300 is housed in the housing section 100. The heat dissipation sheet 303 is attached to the HDD holder 302 with a fixing tape 306 or the like. The fixing tape 306 has heat-resisting property for at least preventing deterioration, breakage, and the like of the fixing tape 306 due to the heat transferred to the heat dissipation sheet 303 from the HDD main-body portion 301. Before attaching the heat dissipation sheet 303 to the HDD holder 302, both end portions of the heat dissipation sheet 303 are bonded to each other through use of tape or the like such that the teardrop shape is formed in side view, for example. The fixing tape 306 is attached to, for example, a rear surface of a surface on which the longitudinal-direction anti-vibration dampers 304 are mounted.

Figure 5:
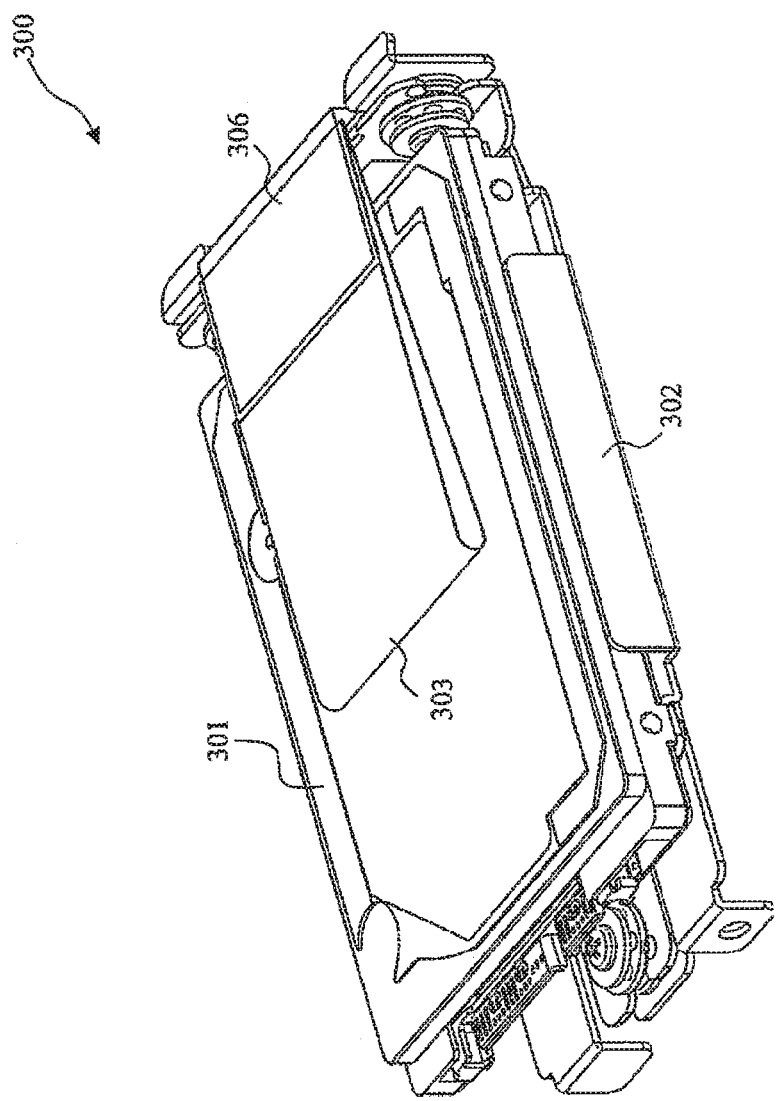
FIG. 5 is a view for illustrating the HDD unit in a state of being housed in a housing section of the main body portion of the electronic apparatus according to the embodiment.
Figure 6A:
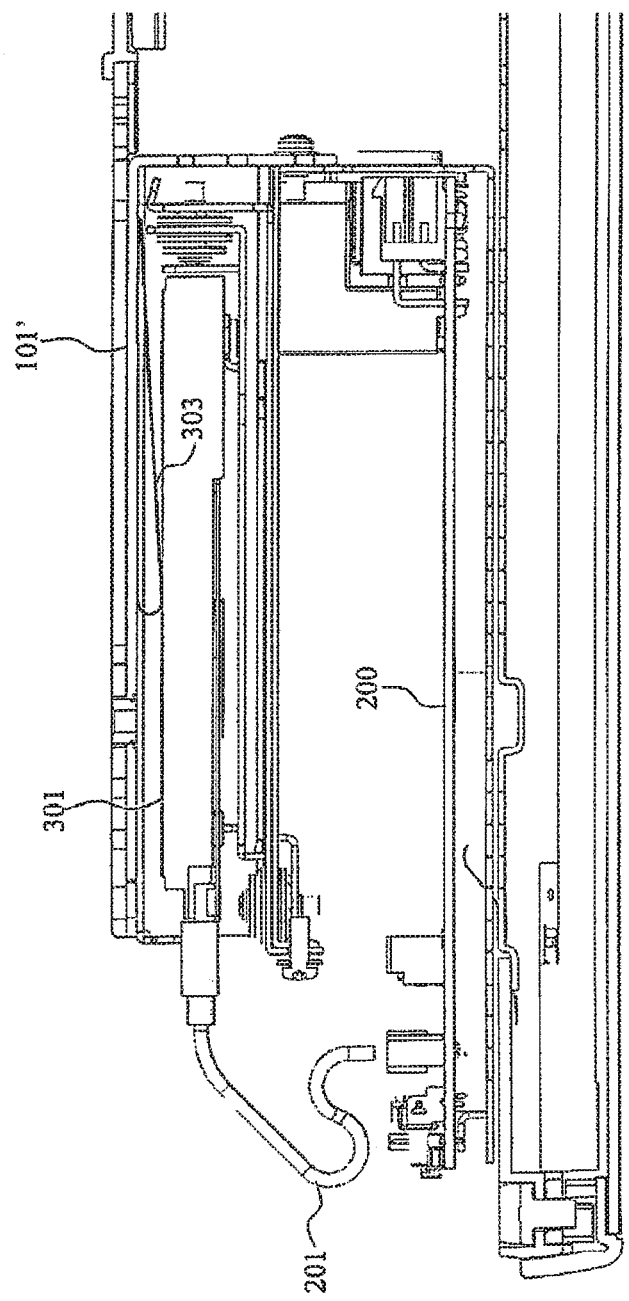
FIG. 6A is a sectional view taken along the line A-A' of FIG. 2.

FIG. 5 is a view for illustrating only the HDD unit 300 in a state of being housed in the housing section 100 (see FIG. 6A). As illustrated in FIG. 5, the heat dissipation sheet 303 that used to be in the teardrop shape is deformed into a shape along the longitudinal direction of the upper surface of the HDD main-body portion 301. As described above, when the HDD unit 300 is housed in the housing section 100, the heat dissipation sheet 303 and the ceiling of the housing section 100 are in abutment, and the heat dissipation sheet 303 and the upper surface of the HDD main-body portion 301 are in abutment. Further, the heat dissipation sheet 303 is flexible and has the teardrop shape. Therefore, there can be prevented occurrence of accidents in which, for example, the heat dissipation sheet 303 gets caught by the housing section 100 when the HDD unit 300 is being housed into the housing section 100 or being removed from the housing section 100.

Instead of the heat dissipation sheet 303, an elastic member that has thermal conductivity and stretchability and is formed into the teardrop shape or a shape similar to the teardrop shape in side view (in cross section in the longitudinal direction) may also be used. The shape similar to the teardrop shape is, for example, a shape having an inclined surface that gradually inclines from one end portion, which is on a side to be inserted into the housing section 100, toward the other end portion, which is rounded. In other words, the shape similar to the teardrop shape is a shape that can prevent occurrence of accidents in which, for example, the heat dissipation sheet 303 gets caught by the housing section 100 when the HDD unit 300 is being housed into the housing section 100 or being removed from the housing section 100. Using such elastic members can have the same effect as a case in which the heat dissipation sheet 303 is used.

Figure 6B:
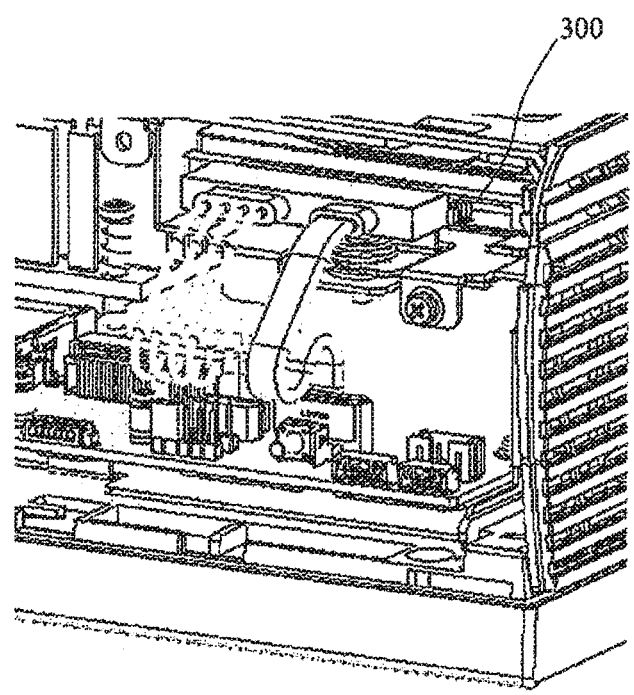
FIG. 6B is a perspective view of a state in which the HDD unit is housed in the housing section of the main body portion of the electronic apparatus according to the embodiment.

Next, a heat dissipation mechanism for the external apparatus is described with reference to FIG. 6A and FIG. 6B. FIG. 6A is a sectional view taken along the line A-A' of FIG. 2, and FIG. 6B is a perspective view of a state in which the HDD unit 300 is housed in the housing section 100.

First, when the HDD unit 300 as illustrated in FIG. 3 is housed into the housing section 100, the heat dissipation sheet 303 and the ceiling of the housing section 100 are in abutment, and the heat dissipation sheet 303 and the upper surface of the HDD main-body portion 301 are in abutment.

The heat dissipation sheet 303 has thermal conductivity, and hence the HDD main-body portion 301 and the housing section 100 are thermally connected to each other via the heat dissipation sheet 303. As a result, the heat generated by the HDD main-body portion 301 is transferred to the housing section 100 via the heat dissipation sheet 303. The housing section 100 may cool the HDD unit 300 by dissipating the heat transferred from the heat dissipation sheet 303 to the outside air through the housing-unit upper surface 101'.

Next, a method of conducting maintenance, e.g., replacement, on the heat dissipation sheet 303 is described with reference to FIG. 7A.

Figure 7A:
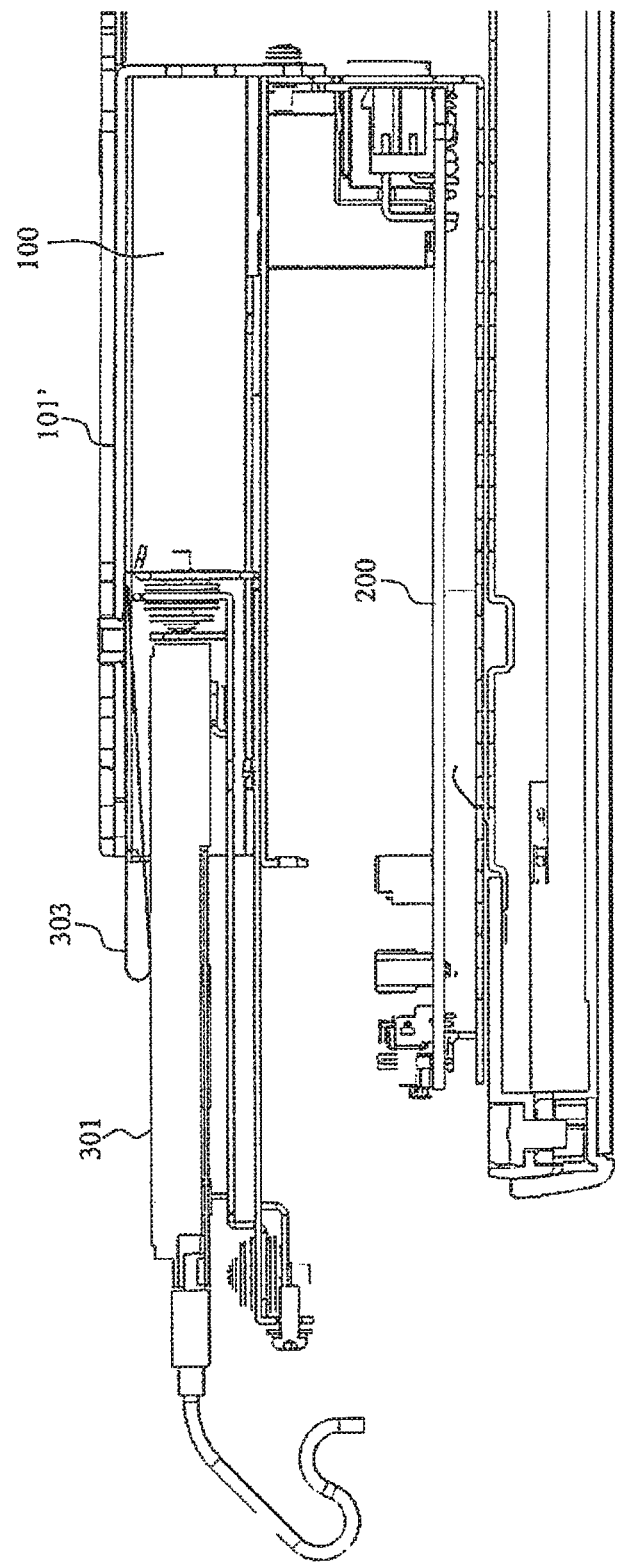
FIG. 7A is a sectional view of the state in FIG. 6A with the HDD unit being pulled out.
Figure 7B:
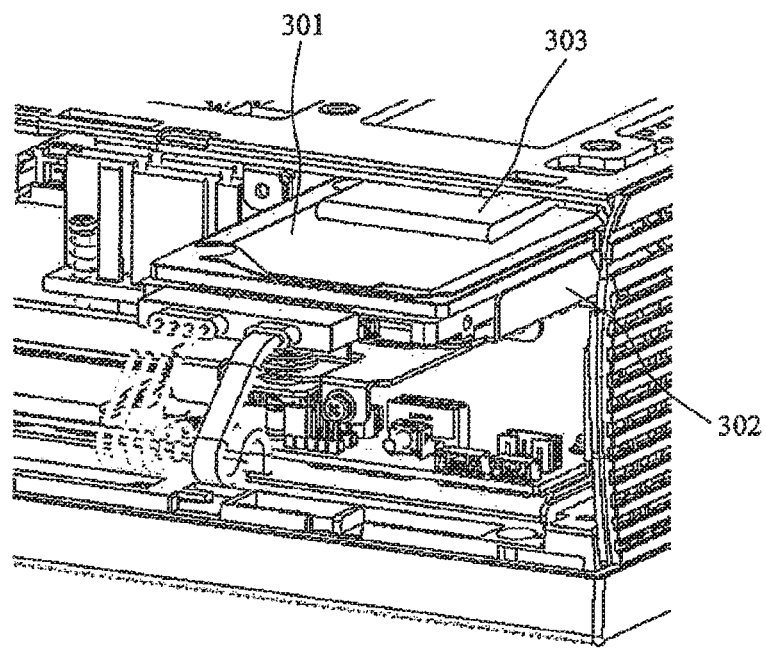
FIG. 7B is a perspective view of a state in which the HDD unit is pulled out from the housing section of the main body portion of the electronic apparatus according to the embodiment.

FIG. 7A is a sectional view of a state in which the HDD unit 300 is pulled out from the housing section 100 and FIG. 7B is a perspective view of a state in which the HDD unit 300 is pulled out from the housing section 100.

First, in order to conduct maintenance on the heat dissipation sheet 303, the HDD unit 300 is pulled out from the housing section 100, and the heat dissipation sheet 303 is also pulled out at the same time. Therefore, when work such as the replacement or maintenance of the heat dissipation sheet 303 is required, the work may easily be conducted without the need of disassembling the housing section 100.

Further, as described above, the housing section 100 may also house an SSD unit having an SSD mounted thereon. In contrast to the HDD, there is no need to attach the heat dissipation sheet 303 to the SSD because the SSD generates small amount of heat. In the heat dissipation mechanism as disclosed in Patent Document 1, the heat dissipation structure is built in the housing section. Therefore, even when the SSD unit, which generates small amount of heat, is to be housed, a heat dissipation structure is unnecessarily included in the housing section, which leads to an increase in cost. This invention is advantageous over the heat dissipation structure as disclosed in Patent Document 1 in terms of costs because when the SSD unit having the SSD mounted thereon is used, the heat dissipation sheet 303 is not attached thereto.

The embodiment of this invention has been described above. However, part or whole of the above-mentioned embodiment can also be described as follows. Note that, the following supplementary notes are not intended to limit this invention.

[Supplementary Note 1]
A heat dissipation structure for an external apparatus in an electronic apparatus,
the electronic apparatus comprising a housing section configured to removably house an external apparatus,
the heat dissipation structure for an external apparatus comprising a heat dissipation portion, which is removably attached to the external apparatus and which has thermal conductivity for transferring heat generated by the external apparatus to the housing section.

[Supplementary Note 2]
A heat dissipation structure for an external apparatus according to Supplementary Note 1, wherein the heat dissipation portion is attached to the external apparatus so as to be in contact with the housing section when the external apparatus is housed in the housing section.

[Supplementary Note 3]
A heat dissipation structure for an external apparatus according to Supplementary Note 1 or 2, wherein the heat dissipation portion comprises a flexible sheet having end portions that are bonded to each other such that a teardrop shape is formed in cross section.

[Supplementary Note 4]
A heat dissipation structure for an external apparatus according to Supplementary Note 1 or 2, wherein the heat dissipation portion comprises a stretchable elastic member having a teardrop shape or a shape similar to the teardrop shape in cross section.

[Supplementary Note 5]
A heat dissipation structure for an external apparatus according to any one of Supplementary Notes 1 to 4, wherein the housing section is arranged in a metal frame of the electronic apparatus.

[Supplementary Note 6]
A heat dissipation structure for an external apparatus according to any one of Supplementary Notes 1 to 5,
wherein the external apparatus comprises an HDD unit comprising an HDD main-body portion and an HDD holder configured to hold the HDD main-body portion, and
wherein the heat dissipation portion is attached to the HDD holder.

[Supplementary Note 7]
An electronic apparatus, comprising a housing section configured to removably house an external apparatus,
the external apparatus having removably attached thereto a heat dissipation portion having thermal conductivity for transferring heat generated by the external apparatus to the housing section.

[Supplementary Note 8]
An electronic apparatus according to Supplementary Note 7, wherein the heat dissipation portion is attached to the external apparatus so as to be in contact with the housing section when the external apparatus is housed in the housing section.

[Supplementary Note 9]
An electronic apparatus according to Supplementary Note 7 or 8, wherein the heat dissipation portion comprises a flexible sheet having end portions that are bonded to each other such that a teardrop shape is formed in cross section.

[Supplementary Note 10]
An electronic apparatus according to Supplementary Note 7 or 8, wherein the heat dissipation portion comprises a stretchable elastic member having a teardrop shape or a shape similar to the teardrop shape in cross section.

[Supplementary Note 11]
An electronic apparatus according to any one of Supplementary Notes 7 to 10, wherein the housing section is arranged in a metal frame of the electronic apparatus.

[Supplementary Note 12]
An electronic apparatus according to any one of Supplementary Notes 7 to 11,
wherein the external apparatus comprises an HDD unit comprising an HDD main-body portion and an HDD holder configured to hold the HDD main-body portion, and
wherein the heat dissipation portion is attached to the HDD holder.

[Supplementary Note 13]
An external apparatus, which is removably housed in a housing section of an electronic apparatus,
the external apparatus having removably attached thereto a heat dissipation portion having thermal conductivity for transferring heat generated by the external apparatus to the housing section.

[Supplementary Note 14]
An external apparatus according to Supplementary Note 13, wherein the heat dissipation portion is attached to the external apparatus so as to be in contact with the housing section when the external apparatus is housed in the housing section.

[Supplementary Note 15]

An external apparatus according to Supplementary Note 13 or 14, wherein the heat dissipation portion comprises a flexible sheet having end portions that are bonded to each other such that a teardrop shape is formed in cross section.

[Supplementary Note 16]

An external apparatus according to Supplementary Note 13 or 14, wherein the heat dissipation portion comprises a stretchable elastic member having a teardrop shape or a shape similar to the teardrop shape in cross section.

[Supplementary Note 17]

An external apparatus according to any one of Supplementary Notes 13 to 16, wherein the housing section is arranged in a metal frame of the electronic apparatus.

[Supplementary Note 18]

An external apparatus according to any one of Supplementary Notes 13 to 17, in which the electronic apparatus is a POS terminal device.

This application claims priority from Japanese Patent Application No. 2014-219466, filed on Oct. 28, 2014, the entire disclosure of which is incorporated herein by reference.

REFERENCE SIGNS LIST

10 . . . POS terminal device
20 . . . main body portion
30 . . . power source unit
40 . . . top cover
50 . . . rear cover
100 . . . housing section
101 . . . metal frame
101' . . . housing-unit upper surface
200 . . . mother board
201 . . . cable
300 . . . HDD unit
301 . . . HDD main-body portion
302 . . . HDD holder
303 . . . heat dissipation sheet
304 . . . longitudinal-direction anti-vibration damper
305 . . . thickness-direction anti-vibration damper
306 . . . fixing tape

The invention claimed is:

1. A heat dissipation structure for an external apparatus in an electronic apparatus,
the electronic apparatus comprising a housing section configured to removably house the external apparatus,
the heat dissipation structure for an external apparatus comprising a heat dissipation portion, which is removably attached to the external apparatus, and which has thermal conductivity for transferring heat generated by the external apparatus to the housing section,
wherein the external apparatus comprises an HDD (hard disk drive) unit comprising an HDD main-body portion and an HDD holder configured to hold the HDD main-body portion,
wherein the heat dissipation portion is formed into a teardrop shape or a shape similar to the teardrop shape in cross section, and is attached to the external apparatus such that an acute-angled portion of the teardrop shape or the shape similar to the teardrop shape is located in a deep side of the housing section, a semicircular portion of the teardrop shape or the shape similar to the teardrop shape is located in a front side of the housing section, and contact with an upper surface of the HDD main-body portion when the external apparatus is housed in the housing section, and
wherein the heat dissipation portion is attached to the external apparatus whereby only a free end extending away from the acute-angled portion of the teardrop shape or the shape similar to the teardrop shape is fixed to the HDD holder, and is not fixed to the HDD main-body portion.

2. The heat dissipation structure for an external apparatus according to claim 1, wherein the heat dissipation portion is attached to the external apparatus so as to be in contact with the housing section when the external apparatus is housed in the housing section.

3. The heat dissipation structure for an external apparatus according to claim 1, wherein the heat dissipation portion comprises a flexible sheet having end portions that are bonded to each other such that the teardrop shape is formed in cross section.

4. The heat dissipation structure for an external apparatus according to claim 1, wherein the heat dissipation portion comprises a stretchable elastic member having the teardrop shape or a shape similar to the teardrop shape in cross section.

5. The heat dissipation structure for an external apparatus according to claim 1, wherein the housing section is arranged in a metal frame of the electronic apparatus.

6. An electronic apparatus, comprising a housing section configured to removably house an external apparatus,
the external apparatus comprises an HDD (hard disk drive) unit comprising an HDD main-body portion and an HDD holder configured to hold the HDD main-body portion, and having removably attached thereto a heat dissipation portion having thermal conductivity for transferring heat generated by the external apparatus to the housing section,
wherein the heat dissipation portion is formed into a teardrop shape or a shape similar to the teardrop shape in cross section, and is attached to the external apparatus such that an acute-angled portion of the teardrop shape or the shape similar to the teardrop shape is located in a deep side of the housing section, a semicircular portion of the teardrop shape or the shape similar to the teardrop shape is located in a front side of the housing section, and overlap with an upper surface of the HDD main-body portion when the external apparatus is housed in the housing section, and
wherein the heat dissipation portion is attached to the external apparatus whereby only a free end extending away from the acute-angled portion of the teardrop shape or the shape similar to the teardrop shape is fixed to the HDD holder and, is not fixed to the HDD main-body portion.

7. The electronic apparatus according to claim 6, wherein the heat dissipation portion is attached to the external apparatus so as to be in contact with the housing section when the external apparatus is housed in the housing section.

8. An external apparatus, which is removably housed in a housing section of an electronic apparatus,
the external apparatus having removably attached thereto a heat dissipation portion having thermal conductivity for transferring heat generated by the external apparatus to the housing section,
wherein the external apparatus comprises an HDD (hard disk drive) unit comprising an HDD main-body portion and an HDD holder configured to hold the HDD main-body portion,
wherein the heat dissipation portion is formed into a teardrop shape or a shape similar to the teardrop shape in cross section, and is attached to the external apparatus such that an acute-angled portion of the teardrop shape or the shape similar to the teardrop shape is located in an deep side of the housing section, a semi-circular portion of the teardrop shape or the shape similar to the teardrop shape is located in a front side of the housing section, and overlap with an upper surface of the HDD main-body portion when the external apparatus is housed in the housing section, and wherein the heat dissipation portion is attached to the external apparatus whereby only a free end extending away from the acute-angled portion of the teardrop shape or the shape similar to the teardrop shape is fixed to the HDD holder and, is not fixed to the HDD main-body portion.

9. The external apparatus according to claim 8, wherein the heat dissipation portion is attached to the external apparatus so as to be in contact with the housing section when the external apparatus is housed in the housing section.

\* \* \* \* \*